United States Patent
Yan

(10) Patent No.: US 7,300,724 B2
(45) Date of Patent: Nov. 27, 2007

(54) INTERFERENCE MULTILAYER CAPPING DESIGN FOR MULTILAYER REFLECTIVE MASK BLANKS

(75) Inventor: Pei-Yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 664 days.

(21) Appl. No.: 10/864,945

(22) Filed: Jun. 9, 2004

(65) Prior Publication Data

US 2005/0277030 A1    Dec. 15, 2005

(51) Int. Cl.
*G03F 1/00*    (2006.01)
(52) U.S. Cl. .......................................... 430/5

(58) Field of Classification Search ................ 403/5, 403/394; 378/35; 428/428, 430
See application file for complete search history.

(56) References Cited

U.S. PATENT DOCUMENTS 6,998,200 B2 * 2/2006 Lee ................ 430/5

\* cited by examiner

*Primary Examiner*—S. Rosasco
(74) *Attorney, Agent, or Firm*—Fish & Richardson P.C.

(57) ABSTRACT

An extreme ultraviolet lithography (EUVL) mask blank may include a multilayer (ML) capping structure on the ML reflective coatings on the substrate. The ML capping structure may include alternating layers of a capping material, e.g., ruthenium, and a material with a lower EUV absorption coefficient, e.g., silicon. The top layer of the ML structure may be a layer of the capping material. Capping interfaces between the layers may provide constructive interference of reflected light.

30 Claims, 4 Drawing Sheets

US 7,300,724 B2

INTERFERENCE MULTILAYER CAPPING DESIGN FOR MULTILAYER REFLECTIVE MASK BLANKS

BACKGROUND

Extreme ultraviolet (EUV) lithography (EUVL) is a promising future lithography technique. EUV light may be produced using a small, hot plasma that will efficiently radiate at a desired wavelength, e.g., in a range of approximately 11 nm to 15 nm.

Reflective masks may be used in EUVL. EUV light is strongly absorbed by many materials, so material choice is an important consideration in EUVL mask design. EUVL masks may include a reflective mask blank covered by a patterned layer of an EUV absorber material. The EUVL mask blank may include multilayer (ML) reflective coatings, e.g., alternating layers of molybdenum (Mo) and silicon (Si), on a substrate.

A capping layer may be provided on the top of the mask blank to protect the ML. A layer of silicon may be used as the capping layer. Since silicon has relatively low EUV absorption, a relatively thick layer of silicon (e.g., 10-20 nm) may be used without significantly sacrificing the reflectivity of the mask blank.

A problem with silicon as a capping material is that it tends to oxidize rather easily. The native oxide may be removed during multiple cleanings. Re-growing of native oxide and consequently removing it during cleaning over several cycles may substantially thin the silicon capping layer, reducing the capping layer's ability to protect the underlying ML from damage. The reflectivity of the blanks may also vary over a relatively large scale as the thickness of the silicon capping layer becomes thinner and non-uniform.

DETAILED DESCRIPTION

Extreme ultraviolet lithography (EUVL) is a promising future lithography technique. EUV light may be produced using a small, hot plasma that will efficiently radiate at a desired wavelength, e.g., in a range of approximately 11 nm to 15 nm.

Figure 1:
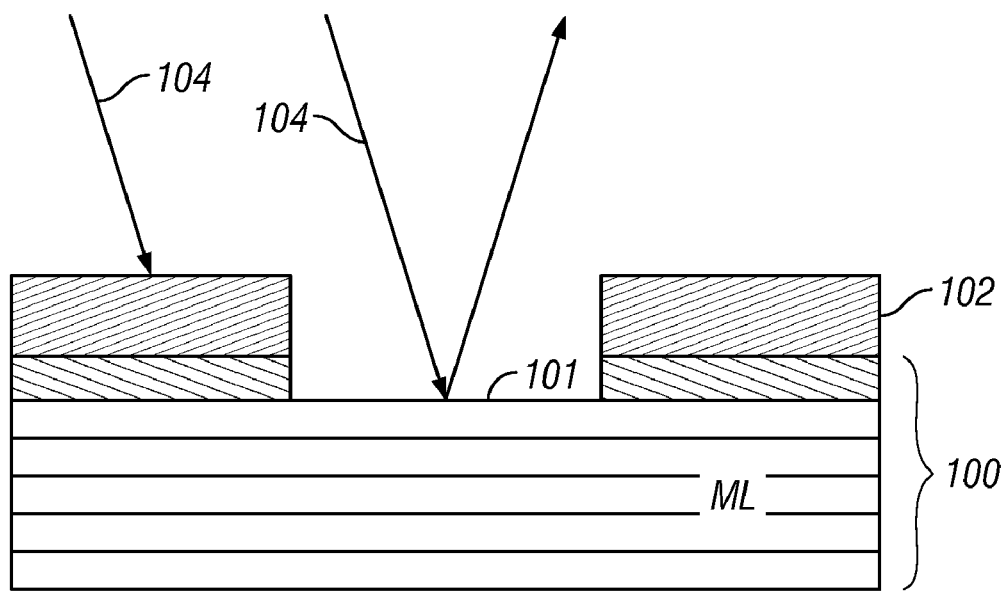
FIG. 1 is a cross-sectional view of an exemplary extreme ultraviolet lithography (EUVL) mask.

Reflective masks may be used in EUVL. EUV light is strongly absorbed by many materials, so material choice is an important consideration in EUVL mask design. FIG. 1 shows an exemplary EUVL mask. The EUVL mask may include a reflective mask blank 100 covered by a patterned layer of an EUV absorber material 102. EUV light 104 may be directed to the mask at an angle and be reflected by an exposed reflective surface 101 and absorbed by the absorber material 102.

Figure 2:
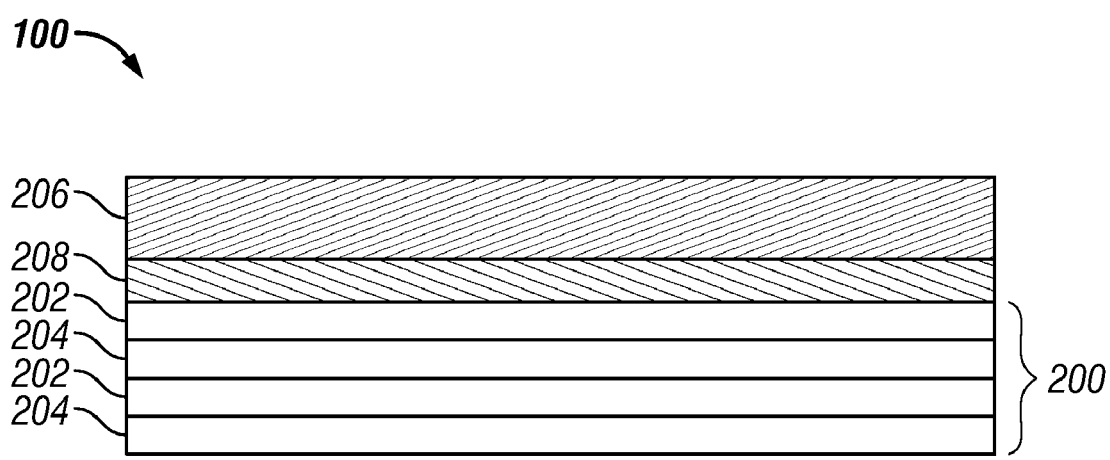
FIG. 2 is a cross-sectional view of an exemplary EUVL mask blank.

FIG. 2 shows an exemplary EUVL mask blank 100. The mask blank may include multilayer (ML) reflective coatings 200 on a substrate. The ML reflective coatings 200 may including alternating layers of molybdenum (Mo) 202 and silicon (Si) 204, with typical thicknesses of 2.8 nm and 4.2 nm, respectively. A capping layer 206 and an inter-diffusion barrier maybe provided underneath the capping layer to prevent material diffusion at interface. Silicon may be used as the capping material. Since silicon has relatively low EUV absorption, a relatively thick layer of silicon (e.g., 10-20 nm) may be used without significantly sacrificing the reflectivity of the mask blank.

A problem with silicon as a capping material is that it tends to oxidize rather easily. The native oxide may be removed during multiple cleanings. Re-growing of native oxide and consequently removing it during cleaning over several cycles may substantially thin the silicon capping layer, reducing the capping layer's ability to protect the underlying ML from damage. The reflectivity of the blanks may also vary over a relatively large scale as the thickness of the silicon capping layer becomes thinner and non-uniform.

An alternative to silicon for a capping material is ruthenium (Ru). Ruthenium capping layers may be more resistant to oxidation and have better chemical cleaning resistance than silicon capping layers. In addition, ruthenium may have advantages in mask fabrication because the etch selectivity of the absorber stack-to-Ru may be much larger than that for a silicon capping layer. However, ruthenium has a higher EUV absorption coefficient than silicon. This may limit the thickness of the ruthenium capping layer, e.g., to about 2 nm, since thicker capping layers may drastically reduce the reflectivity of the ML surface 101. A ruthenium capping layer of only 2 nm may be very susceptible to damage during the mask patterning process and may not be sustainable during normal mask usage.

Figure 3:
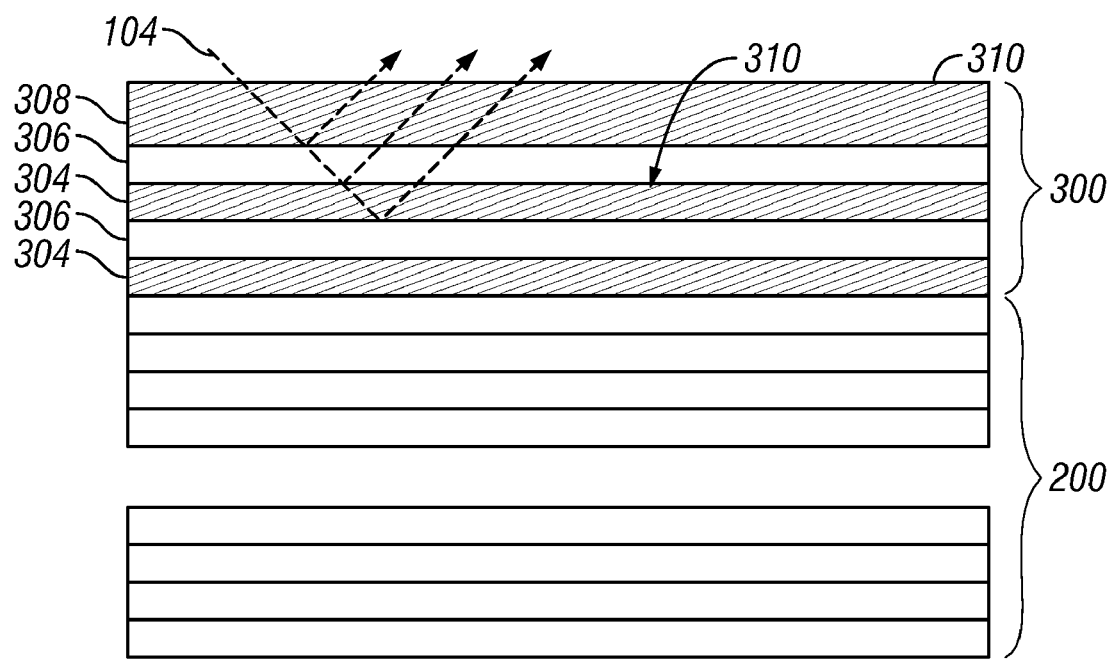
FIG. 3 is a cross-sectional view of an EUVL mask blank according to an embodiment.

In an embodiment, an ML capping structure 300 may be used as a capping layer, as shown in FIG. 3. The ML capping structure 300 may include several layers. The layers may be alternating layers of a capping material 304, e.g., ruthenium, and a material 306 with a low EUV absorption coefficient, e.g., silicon. The top layer 308 of the ML structure 300 may be a layer of the capping material.

The thickness of the layers in the ML capping structure 300 may be selected such that the light reflected at the ML capping interfaces 310, e.g., Ru/Si interfaces, interferes constructively. Constructive interference may occur when light waves reflected at the interfaces between materials with different indices of refraction (n) are shifted by an integer multiple of wavelengths. The shifting may account for any phase shift introduced by a reflection off the higher-n material (e.g., ruthenium), as well as for the extra distance traveled by the wave traveling down and back through the film.

During exposure, the EUV light directed onto the ML capping structure 300 only passes a thin (e.g., 2 nm thick) ruthenium layer before it hits the first ML capping interface 310. At the interface, a maximum reflection may occur due to the constructive interference ML design. As a result, the light absorbed by the second ML capping pair may be much less because a significant amount of light is reflected back at the first interface. The same situation may apply to the third, fourth, etc. ML capping interfaces 310. As a result, for the same accumulative capping material thickness, the ML capping design may yield much higher reflectivity than that of single ML capping design.

Table 1 shows a comparison of ML blank reflectivity vs. total capping thickness using a single layer ruthenium capping and an ML capping structure.

TABLE 1

| Total Capping Thickness (nm) | 2 | 4 | 6 | 8 | 10 |
|---|---|---|---|---|---|
| ML Interference Capping Layer (Ru/Si) | R = 74% | R = 73.6% | R = 73% | R = 72.7% | R = 72.2% |
| Single Capping Layer (Ru) | R = 74% | R = 67.2% | R = 58% | R = 57.2% | R = 59% |

The ML capping structure 300 may enable a thicker capping layer at a much lower reflectivity penalty than for a single layer ruthenium capping with the same thickness. A thicker capping layer may provide additional protection for the ML mask blank during fabrication and cleaning. This may be especially important in EUVL systems which, unlike system which use transmissive masks, may not include a pellicle to protect the surface(s) of the mask in the lithography tool. Consequently, the mask may undergo several cleanings (e.g., etch cleaning) during its effective lifetime. A thicker capping layer may also provide robust protection to the ML reflective coatings 200 during mask patterning, repair, cleaning, and exposure. For a given capping layer thickness, the ML capping structure design may provide a larger process margin on both capping layer deposition thickness control and non-uniform removal of the capping layer in the patterning process.

Figure 4:
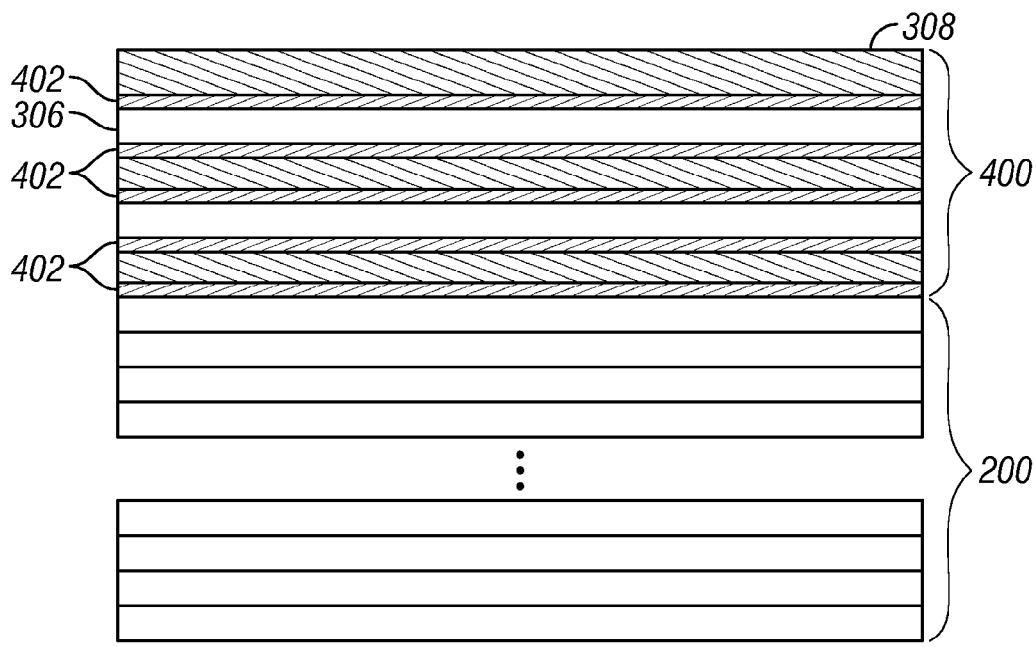
FIG. 4 is a cross-sectional view of an EUVL mask blank according to an alternative embodiment.

FIG. 3 shows an embodiment including Ru/Si capping layer pairs. FIG. 4 shows an alternative embodiment in which a barrier layer 402 (e.g., B4C or Mo) is provided between the capping material 304 (e.g., Ru) and the low EUV absorption material 306 (e.g., Si) to form a ruthenium/barrier/silicon ML capping structure 400.

Figure 5:
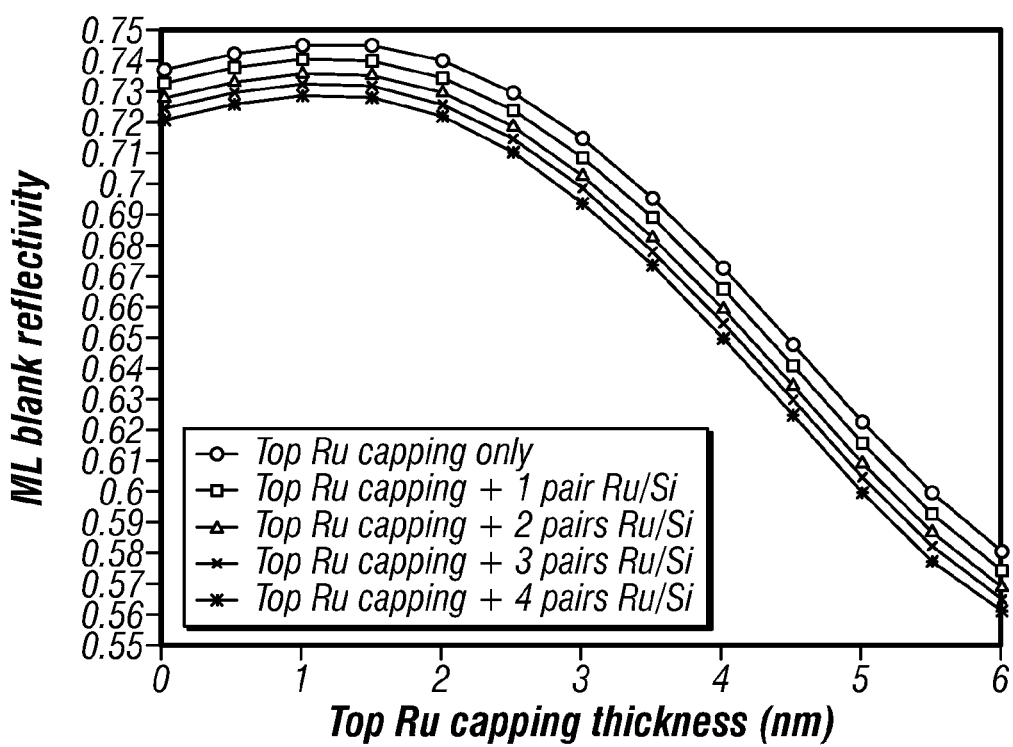
FIG. 5 is a plot showing simulation results for EUVL mask blanks with a multilayer capping layers according to an embodiment.

FIG. 5 shows the results of simulations in the case of zero (single layer Ru), one, two, three, and four ruthenium/silicon ML capping pairs with a 2 nm thick ruthenium top capping layer. The equivalent ruthenium thickness for the interference ML capping structures with zero, one, two, three, and four capping pairs are 2 nm, 4 nm, 6 nm, 8 nm, and 10 nm, respectively, and the corresponding finished mask reflectivities are about 74%, 73.6%, 73%, 72.7%, and 72.2%, respectively. The simulation has neglected the inter-diffusion layers between molybdenum/silicon in the ML stack and between ruthenium/silicon in the capping layer pairs. The reflectivity may be slightly lower when the inter-diffusion layer is considered.

In the event of first 2 nm ruthenium capping layer breaking though during the mask process (e.g., during etch or multiple cleaning), the additional ruthenium layer(s) may continue to protect the mask. Furthermore, the partial removal of a few ruthenium layers may have very little impact to the printing on the mask since both reflectivity error and phase error may be small.

Figure 6:
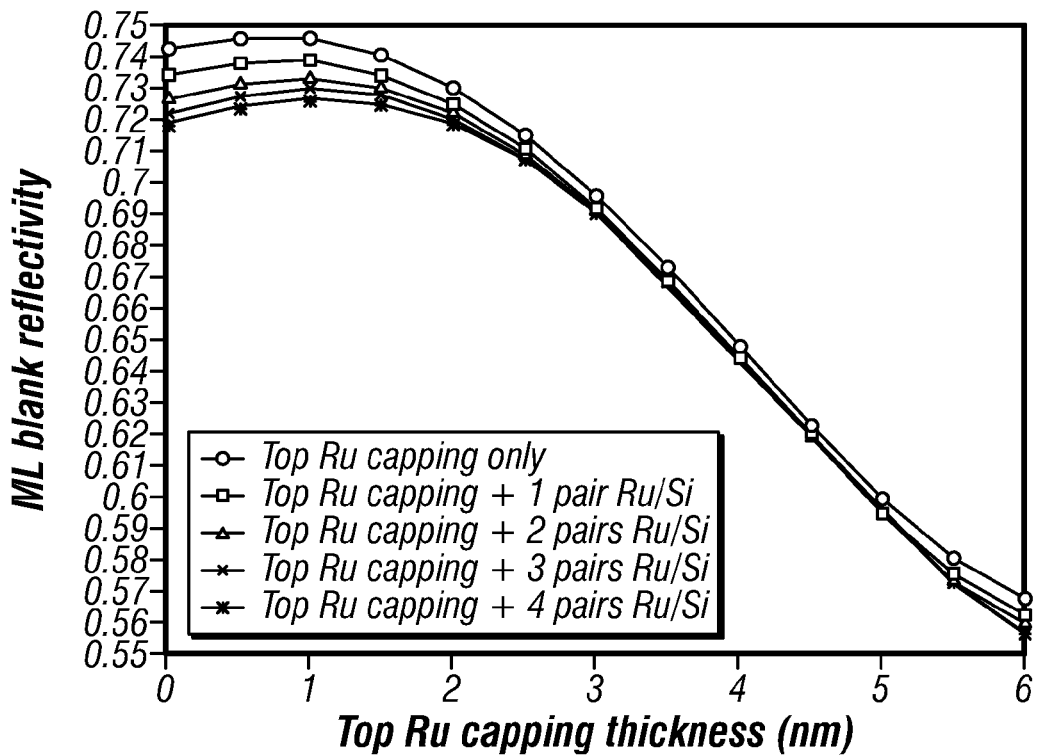
FIG. 6 is a plot showing simulation results for EUVL mask blanks with a multilayer capping layers according to an alternative embodiment.

FIG. 6 shows the results of simulations in the case of zero (single layer Ru), one, two, three, and four ruthenium/barrier/silicon ML capping pairs with a 2 nm thick ruthenium top capping layer. The ML capping structures in the simulation included 5 Å Mo barrier layers on Ru-on-Si interfaces and 3 Å Mo barrier layers on Si-on-Ru interfaces.

The additional possible inter-diffusion between Mo/Si and between Ru/Mo are neglected in the simulation.

Figure 7:
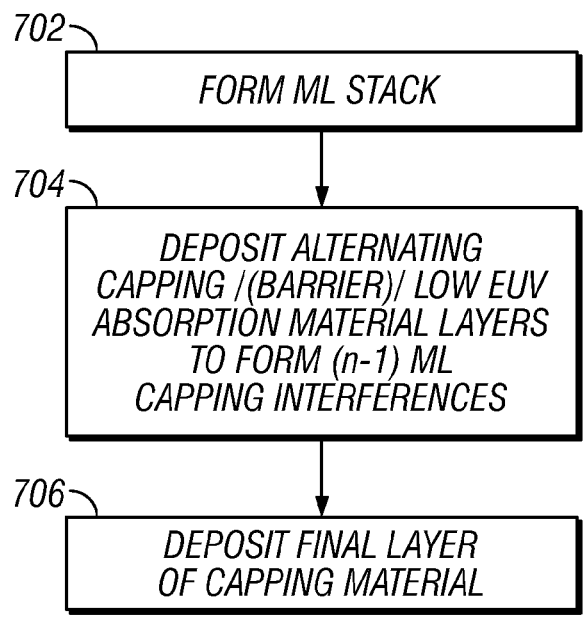
FIG. 7 is a flowchart describing a method for manufacturing an EUVL blank according to an embodiment.

FIG. 7 is a flowchart describing a method for manufacturing an EUVL blank according to an embodiment. After forming ML reflective coatings (ML stack) (block 702), alternating layers of a capping material (e.g., ruthenium) and a low EUV absorption material (e.g., silicon) may be deposited to form n-1 ML capping interferences (block 704). A barrier layer such as B4C or Mo may also be deposited between the capping/low EUV absorption material layers. A final layer of capping material may be deposited to form an ML capping structure with n ML capping interferences (block 706).

Ruthenium has been described as the capping material, however other capping materials, such as boron carbide ($B_4C$) may be used.

A number of embodiments have been described. Nevertheless, it will be understood that various modifications may be made without departing from the spirit and scope of the invention. For example, blocks in the flowchart may be skipped or performed out of order and still produce desirable results. Accordingly, other embodiments are within the scope of the following claims.

The invention claimed is:

1. An article comprising:
 a substrate;
 multilayer reflective coatings on the substrate; and
 a multilayer capping structure on the multilayer reflective coatings, the multilayer capping structure including a plurality of capping interfaces, a capping interface in said plurality adapted to reflect light that constructively interferes with light reflected by another of said plurality of capping interfaces.

2. The article of claim 1, wherein the multilayer capping structure comprises:
 a layer of a first material having a coefficient of absorption for said light;
 a layer of a second material having a lower coefficient of absorption for said light than the first material; and
 one of said plurality of capping interfaces between the layer of the first material and the layer of the second material.

3. The article of claim 2, further comprising:
 a top layer of the first material.

4. The article of claim 2, wherein the first material comprises ruthenium.

5. The article of claim 2, wherein the first material comprises boron carbide.

6. The article of claim 2, wherein the second material comprises silicon.

7. The article of claim 1, wherein the plurality of capping interfaces are adapted to reflect extreme ultraviolet light.

8. The article of claim 1, wherein the capping structure comprises:

alternating layers of a capping material and a low absorption material, said low absorption material having a lower coefficient of absorption for extreme ultraviolet light than the capping material.

9. The article of claim 8, further comprising:
a barrier layer between a layer of the capping material and a layer of the low absorption material.

10. The article of claim 9, wherein the barrier layer comprises Boron Carbide or Molybdenum.

11. The article of claim 1, wherein the multilayer reflective coatings comprises alternating layers of molybdenum and silicon.

12. The article of claim 1, wherein the article comprises an extreme ultraviolet lithography mask blank.

13. The article of claim 1, wherein the multilayer capping structure has a thickness of between about 4 nm and 10 nm.

14. A reflective mask comprising:
a substrate;
multilayer reflective coatings on the substrate;
a multilayer capping structure on the multilayer reflective coatings, the multilayer capping structure including a plurality of capping interfaces, a capping interface in said plurality adapted to reflect light that constructively interferes with light reflected by another of said plurality of capping interfaces; and
a patterned layer of an absorber material on the multilayer capping structure, the absorber material adapted to absorb one or more wavelengths of light.

15. The reflective mask of claim 14, wherein the absorber material is adapted to absorb extreme ultraviolet light, and wherein the plurality of capping interfaces are adapted to reflect extreme ultraviolet light.

16. The reflective mask of claim 14, wherein the multilayer capping structure comprises:
a layer of a first material having a coefficient of absorption for said light;
a layer of a second material having a lower coefficient of absorption for said light than the first material; and
one of said plurality of capping interfaces between the layer of the first material and the layer of the second material.

17. The reflective mask of claim 16, further comprising:
a top layer of the first material.

18. The reflective mask of claim 16, wherein the first material comprises ruthenium.

19. The reflective mask of claim 16, wherein the first material comprises boron carbide.

20. The reflective mask of claim 16, wherein the second material comprises silicon.

21. The reflective mask of claim 14, wherein the capping structure comprises:
alternating layers of a capping material and a low absorption material, said low absorption material having a lower coefficient of absorption for extreme ultraviolet light than the capping material.

22. The reflective mask of claim 21, further comprising:
a barrier layer between a layer of the capping material and a layer of the low absorption material.

23. The reflective mask of claim 22, wherein the barrier layer comprises silicon oxide.

24. The reflective mask of claim 14, wherein the multilayer reflective coatings comprises alternating layers of molybdenum and silicon.

25. The reflective mask of claim 14, wherein the reflective mask comprises an extreme ultraviolet lithography mask blank.

26. The reflective mask of claim 14, wherein the multilayer capping structure has a thickness of between about 4 nm and 10 nm.

27. A method comprising:
forming multilayer reflective coatings on a substrate;
depositing alternating layers of a first material and a second material on the multilayer stack, the first material having a higher absorption coefficient for one or more wavelengths of light than the second material; and
depositing a capping layer of the first material to produce a reflective mask blank.

28. The method of claim 27, wherein said depositing alternating layers comprises generating a plurality of capping interfaces, a capping interface in said plurality adapted to reflect light that constructively interferes with light reflected by another of said plurality of capping interfaces.

29. The method of claim 27, wherein said depositing alternating layers comprises depositing alternating layers of ruthenium and silicon.

30. The method of claim 27, wherein said depositing alternating layers comprises depositing a layer of a buffer material between a layer of the first material and a layer of the second material.

* * * * *